US009325100B2

(12) United States Patent
Hirschy

(10) Patent No.: US 9,325,100 B2
(45) Date of Patent: Apr. 26, 2016

(54) ADAPTER FRAME WITH INTEGRATED EMI AND ENGAGEMENT ASPECTS

(75) Inventor: Christopher D. Hirschy, Conway, AR (US)

(73) Assignee: Molex, LLC, Lisle, IL (US)

( * ) Notice: Subject to any disclaimer, the term of this patent is extended or adjusted under 35 U.S.C. 154(b) by 80 days.

(21) Appl. No.: 13/881,552

(22) PCT Filed: Oct. 25, 2011

(86) PCT No.: PCT/US2011/057703
§ 371 (c)(1),
(2), (4) Date: Jun. 19, 2013

(87) PCT Pub. No.: WO2012/061142
PCT Pub. Date: May 10, 2012

(65) Prior Publication Data
US 2014/0154912 A1    Jun. 5, 2014

Related U.S. Application Data

(60) Provisional application No. 61/406,458, filed on Oct. 25, 2010.

(51) Int. Cl.
| | | |
|---|---|---|
| H01R 13/00 | (2006.01) | |
| H01R 13/46 | (2006.01) | |
| H01R 13/6595 | (2011.01) | |
| H05K 9/00 | (2006.01) | |
| H01R 13/6583 | (2011.01) | |

(52) U.S. Cl.
CPC ............ *H01R 13/46* (2013.01); *H01R 13/6595* (2013.01); *H05K 9/0058* (2013.01); *H01R 13/6583* (2013.01)

(58) Field of Classification Search
CPC .................. H01R 13/6587; H01R 13/6594
USPC .............. 439/485, 487, 607.2–607.21, 607.4; 361/704
See application file for complete search history.

(56) References Cited

U.S. PATENT DOCUMENTS

| | | | | | |
|---|---|---|---|---|---|
| 5,767,999 | A | * | 6/1998 | Kayner | ......................... 398/164 |
| 6,808,420 | B2 | | 10/2004 | Whiteman, Jr. et al. | |
| 6,913,490 | B2 | | 7/2005 | Whiteman, Jr. et al. | |
| 6,980,437 | B2 | * | 12/2005 | Bright | ........................... 361/704 |
| 7,371,965 | B2 | * | 5/2008 | Ice | .................................. 174/50 |
| 7,433,193 | B2 | * | 10/2008 | Yee et al. | ....................... 361/715 |
| 7,625,223 | B1 | * | 12/2009 | Fogg | ............................... 439/92 |
| 7,859,849 | B2 | * | 12/2010 | Ice | ............................... 361/715 |

(Continued)

FOREIGN PATENT DOCUMENTS

CN           2657345 Y       11/2004

OTHER PUBLICATIONS

International Search Report for PCT/US2011/057703.

*Primary Examiner* — Xuong Chung Trans
(74) *Attorney, Agent, or Firm* — Stephen L. Sheldon

(57) ABSTRACT

A receptacle assembly with improved EMI leakage reduction and construction is described. The assembly includes a housing in the form of a guide frame that has a hollow interior which accommodates the insertion of an electronic module therein. A heat sink is provided to dissipate heat generated during operation of a module and the heat sink has a base portion that defines a ceiling of the hollow interior. An opening in the top of the guide frame provides an attachment location for the heat sink. A separately formed base plate is inserted into the housing and it defines a bottom of the interior of the housing.

20 Claims, 16 Drawing Sheets

(56) References Cited

U.S. PATENT DOCUMENTS

| | | | |
|---|---|---|---|
| 8,053,667 B2 * | 11/2011 | Chen et al. ................ 174/50 |
| 2003/0171033 A1 | 9/2003 | Bright et al. |
| 2007/0197095 A1 | 8/2007 | Feldman et al. |
| 2010/0018738 A1 | 1/2010 | Chen et al. |
| 2010/0178790 A1 | 7/2010 | Bright et al. |
| 2012/0058670 A1 | 3/2012 | Regnier et al. |

* cited by examiner

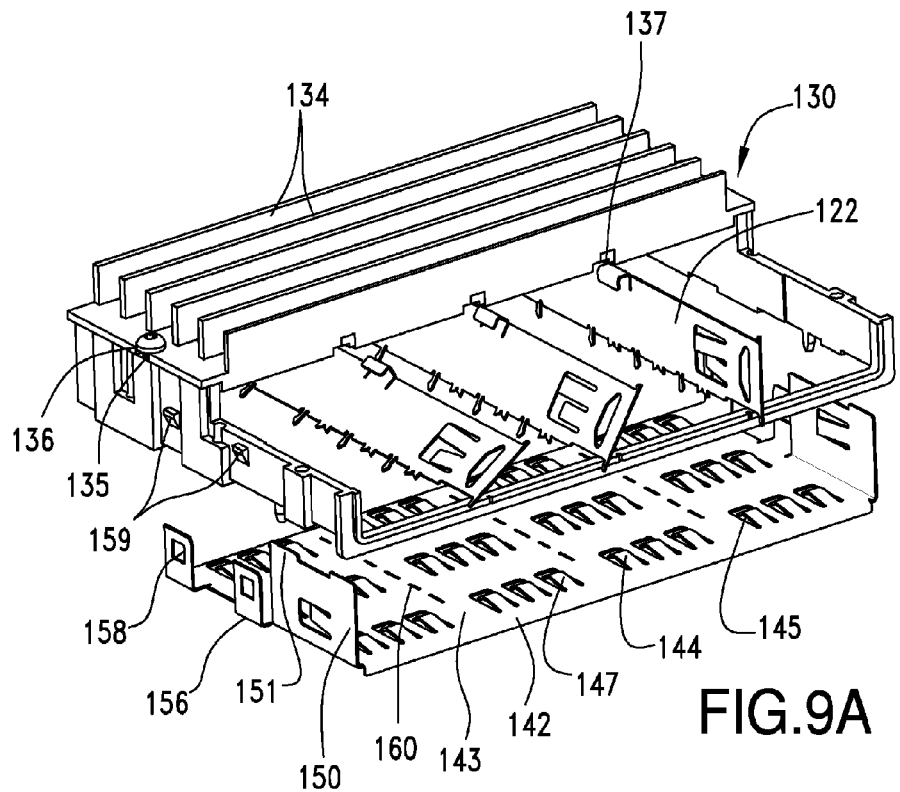
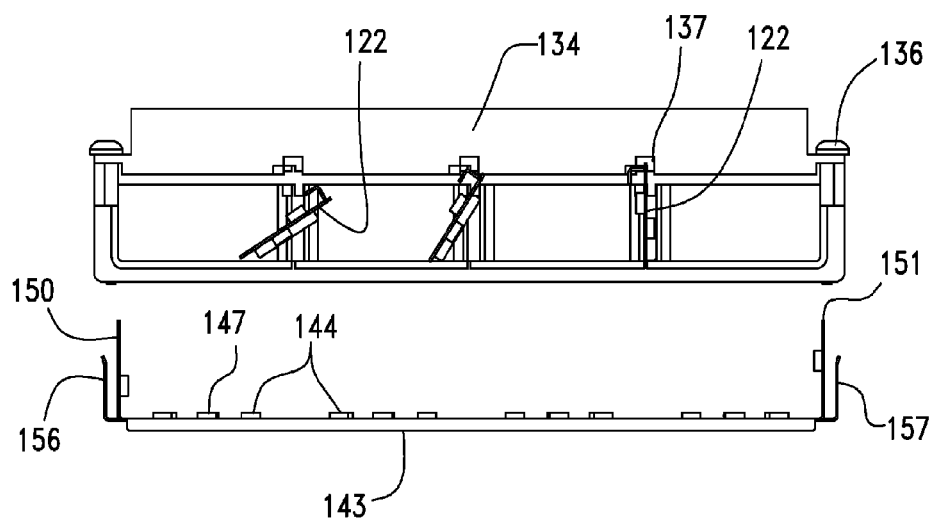

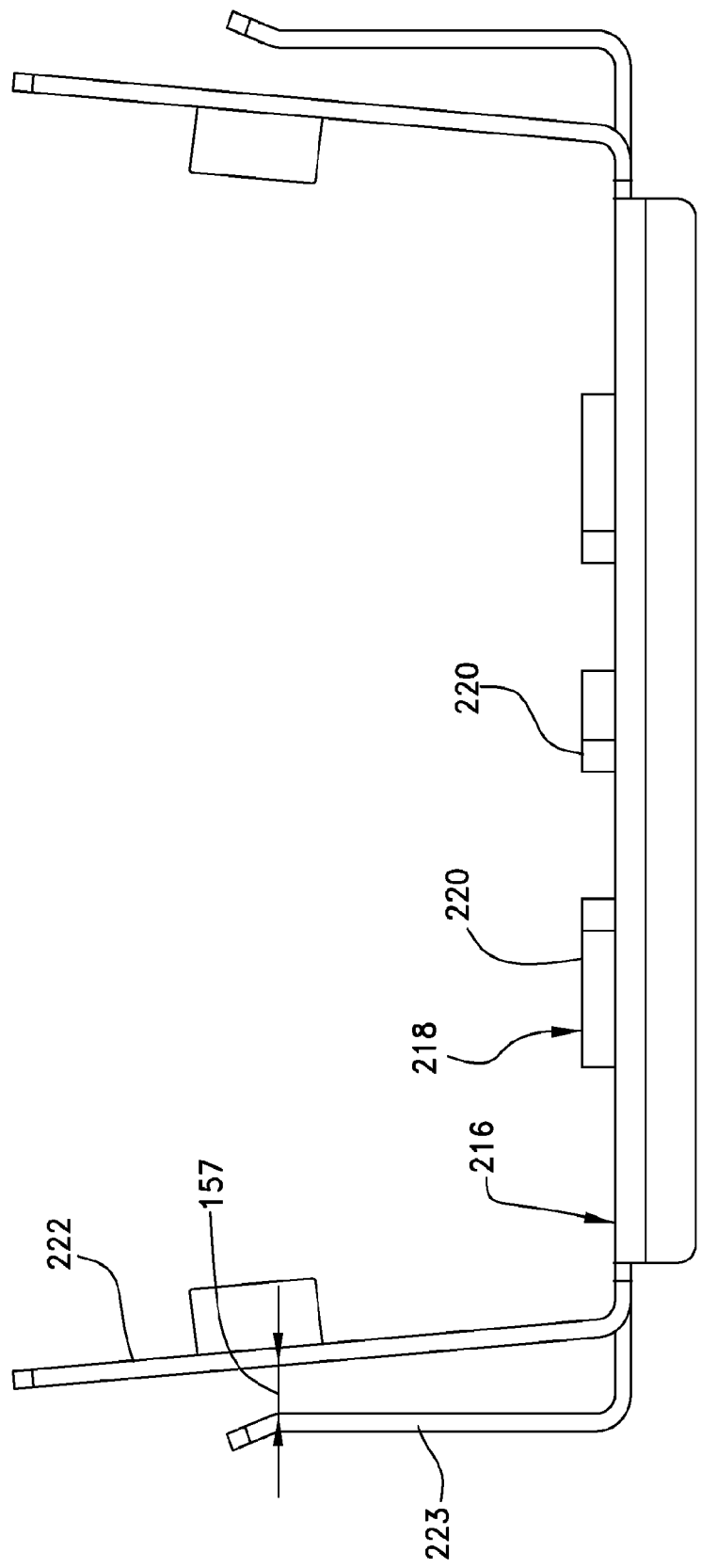

ADAPTER FRAME WITH INTEGRATED EMI AND ENGAGEMENT ASPECTS

REFERENCE TO RELATED APPLICATIONS

The Present Disclosure claims priority to prior-filed U.S. Provisional Patent Application No. 61/406,458, entitled "Adapter Frame With Integrated EMI And Engagement Aspects," filed on 25 Oct. 2010 with the UNITED STATES PATENT AND TRADEMARK OFFICE. The content of the aforementioned patent application is fully incorporated in its entirety herein.

BACKGROUND OF THE PRESENT DISCLOSURE

The Present Disclosure relates, generally, to adapter frames and cages utilized to receive and shield electronic modules therein, and more particularly, to adapter frame and cage assemblies that integrate heat sinks, electromagnetic interference ("EMI") shields and the like.

The use of pluggable modules in the electronics field is growing. Pluggable modules may be used in association with ordinary, copper-based electrical systems or they may be used in association with fiber-optic systems. However, pluggable modules used in high-speed systems generate significant heat, which must be carried away from the module in order to keep its operating temperature down to a level for which it was designed. Pluggable modules are typically inserted into a shielding cage, which shields the connection between an edge card protruding from the insertion end of a module and a receptacle connector that is mounted to a printed circuit board ("PCB"). The shielding cage is mounted to the PCB and forms a hollow space that envelops the receptacle connector. To remove the heat, the industry has adopted the use of heat sinks.

Once such heat sink is described and shown in U.S. Pat. No. 6,816,376, assigned to Tyco Electronics, wherein the shielding cage has an opening formed in its top wall, or roof. This opening permits access to the interior of the shielding cage and to the pluggable module. A terminally-conductive heat sink has a base that extends into the interior of the shielding cage and into contact with the top of the pluggable module. The heat sink is designed so that its base touches the top surface of the module and a rim that extends around the heat sink base sits on and makes contact with the shielding cage. A hold down clip is provided to maintain the heat sink in contact with the module and this clip is designed to flex in response to upward movement of the heat sink. The content of this patent is incorporated herein in its entirety.

One problem that occurs with such a structure is that either the module or the shielding cage, or both, may be manufactured out of dimension. If so, the heat sink rim separates, either partially or wholly, from contact with the shielding cage to create a gap and depending upon the severity of the misalignment, this gap may extend around the entire extent of the opening in the upper surface of the cage. Where the gap occurs between the heat sink and the cage, it defines a portal for the emanation of EMI. Designers strive to achieve the lowest possible leakage of EMI from any cage, as the EMI is prone to interfere with the transmission of signals through the module and through other electronic devices in proximity to the cage and module. Shielding cages and similarly, adapter frames, that also are intended to receive electronic modules typically have a series of holes, or penetrations, formed therein in order to provide functional features, such as engagement or insertion points and the like. These openings are relatively large in size and provide ports through which EMI may escape. In view of the high data rates that are desired by the industry, these holes have become smaller, yet they still provide a source of EMI leakage. This is because as the data rates increase, EMI can travel through smaller holes.

Additional problems occur with the use of shielding cages that are stamped and formed from sheet metal in mounting the cages to their supporting PCBs. Typically compliant or press-fit pins are stamped from the cage bottom and bent into a vertical orientation. Although received in a through-hole in the PCB and sometimes soldered thereto, the opening in the cage bottom from which the mounting pin was stamped defines an opening in the cage that is susceptible to EMI leakage. Additionally, forces generated by insertion of the module into the receiving cage/frame may be large and can impose stress and excessive loads on the compliant pins.

In view of such problems, it is therefore desirable to provide a shielding cage or adapter frame that has an EMI reduction solution associated with it, and possesses good thermal conductivity and robust mounting capabilities.

SUMMARY OF THE PRESENT DISCLOSURE

Accordingly, there is provided an improved shielding cage, preferably taking the form of an adapter frame, designed as a PCB-mounted receptacle, which accommodates the insertion of an electronic module therein, and also an exterior heat sink member that forms an upper wall of the adapter frame and which contacts the module. The cage includes a plurality of sides, or walls, defining a hollow interior configured to house a receptacle connector mounted to a PCB.

In one aspect of the Present Disclosure, the frame includes a plurality of mounting members in the form of depending legs that serve to position the adapter frame in a desired location on the PCB, and further include a plurality of second mounting members, in the form of threaded bosses or the like, aligned with openings in the PCB and receiving screws therein to securely fasten the frame to the circuit board, permit it to be mounted to a circuit board over the receptacle connector. In order to facilitate the insertion of a pluggable module into the cage and into engagement with the receptacle connector, the cage has an opening disposed at an entrance thereof that is sized to receive an electronic module therein.

In another aspect, the adapter frame has an opening that is disposed in and extends along a top portion of the adapter frame. This opening receives a heat sink member. The heat sink member has a flat base portion from which a plurality of heat dissipating members, or fins extend. In order to provide reliable contact with the module(s) of the adapter frame, the heat sink member base portion may have one or more slots formed therein that extend longitudinally and which receive support ribs that likewise extend longitudinally and may be considered to divide the opening into sub-openings, each of which corresponds to a single module-receiving bay of the adapter frame. These ribs are further slotted and each such slot receives a portion of an inner wall member that is inserted into the adapter frame to divide the adapter frame into a plurality of individual module-receiving bays. Both the adapter frame and the heat sink member may be die cast and these two elements may be held reliably held together by means of threaded fasteners, such as screws or the like. The bottom surface of the heat sink member base portion forms the top wall of the interior module-receiving bays of the adapter frame.

In order to provide a means for urging, or maintaining the modules in an upward direction in contact with the heat sink member base portion, the adapter frame preferably includes an insert member taking the form of a base plate. This base plated defines the bottom wall of the adapter frame as well as the bottom walls of each of the individual module-receiving bays. This urging/maintaining means includes a plurality of resilient contact members, that may take the form of spring arms that are punched, or otherwise formed, in base plate and which are arranged in a pattern that extends between the entrance of the adapter frame and the front face of the connector(s) housed in the adapter frame. These contacting members are formed as individual spring arms that are elastic in nature and which extend away from the base plate, toward the heat sink member base portion. The contacting members are slightly depressed when an electronic module is inserted into one of the module-receiving bays and they exert an upward force, due to their elastic nature on the bottom of the module and consequently urge it into contact with the heat sink member base portion.

The contacting members preferably take the form of simple elongated, cantilevered arms, or they may be formed with curved free ends or other shapes as may be deemed suitable for establishing a plurality of contact points underneath the module. Such a structure eliminates dimensional contact problems that may occur due to mis-tolerance manufacturing of any particular module. The base plate is stamped and formed from sheet metal, a material different than that of the die cast adapter frame and hence, the adapter frame assembly of the disclosure has a hybrid construction, which permits the formation of the elastic contacting members and which permits the formation of other functional features that benefit the operation of adapter frames constructed in accordance with the Present Disclosure. In yet another aspect of the Present Disclosure, the base plate may be formed with two sidewalls and may engage other wall members such that the two sidewalls define at least a portion of the sides of a single module-receiving bay in a single bay adapter frame, or in conjunction with distinct inner wall members, define such a module-receiving bay. As such, adapter frames of the Present Disclosure are particularly suitable for use in adapter frames that includes ganged, or a plurality of, adjacently arranged module-receiving bays, as well as singular bays.

The sidewalls and inner wall members may have latching members formed therein which extend into the interior of the module-receiving bays so as to provide points at which the inserted modules can be securely latched in place within the adapter frame. These points are easily formed from the sheet metal and eliminate the need for complex mold construction of the die cast adapter frame. The base plate may further include one or more tabs that are arranged in a spaced apart fashion from the sidewalls so that the sidewalls can be angled slightly outwardly to define a spacing between the sidewalls and the tabs that is less than an associated thickness of the sides of the adapter frame. In this manner, when the base plate is inserted into the adapter frame the sidewalls are urged slightly outwardly so that they will desirably lie flush against the inner surfaces of the adapter frame sides. The top ends of the base plate sidewalls may also be configured to be received within corresponding slots formed in the adapter frame.

In yet still another aspect, the inner wall upper edges are received in slots formed in the adapter frame ribs, while their lower edges are configured with compliant pins for engagement with through holes of the circuit board. These pins are received within and extend through slots formed in the base plate. These pins provided grounding points within the perimeter of the base plate. The inner walls may further be formed with one or more members that extend into respective module-receiving bays and, as such, define tabs that serve as polarizing, or alignment features, that permit the full insertion of any modules therein only in the correct fashion.

These and other objects, features and advantages of the present invention will be clearly understood through a consideration of the following detailed description.

BRIEF DESCRIPTION OF THE FIGURES

The organization and manner of the structure and operation of the Present Disclosure, together with further objects and advantages thereof, may best be understood by reference to the following Detailed Description, taken in connection with the accompanying Figures, wherein like reference numerals identify like elements, and in which:

FIG. 9A is a sectional view of the assembly of FIG. 8, taken along Line 8-8 thereof;

FIG. 9B is a front elevational view of the assembly of FIG. 9A;

FIG. 17 is a front elevational view of the base plate used in the adapter frame of FIG. 16.

DESCRIPTION OF THE PREFERRED EMBODIMENTS

While the Present Disclosure may be susceptible to embodiment in different forms, there is shown in the Figures, and will be described herein in detail, specific embodiments, with the understanding that the disclosure is to be considered an exemplification of the principles of the Present Disclosure, and is not intended to limit the Present Disclosure to that as illustrated.

In the embodiments illustrated in the Figures, representations of directions such as up, down, left, right, front and rear, used for explaining the structure and movement of the various elements of the Present Disclosure, are not absolute, but relative. These representations are appropriate when the elements are in the position shown in the Figures. If the description of the position of the elements changes, however, these representations are to be changed accordingly.

Figure 1:
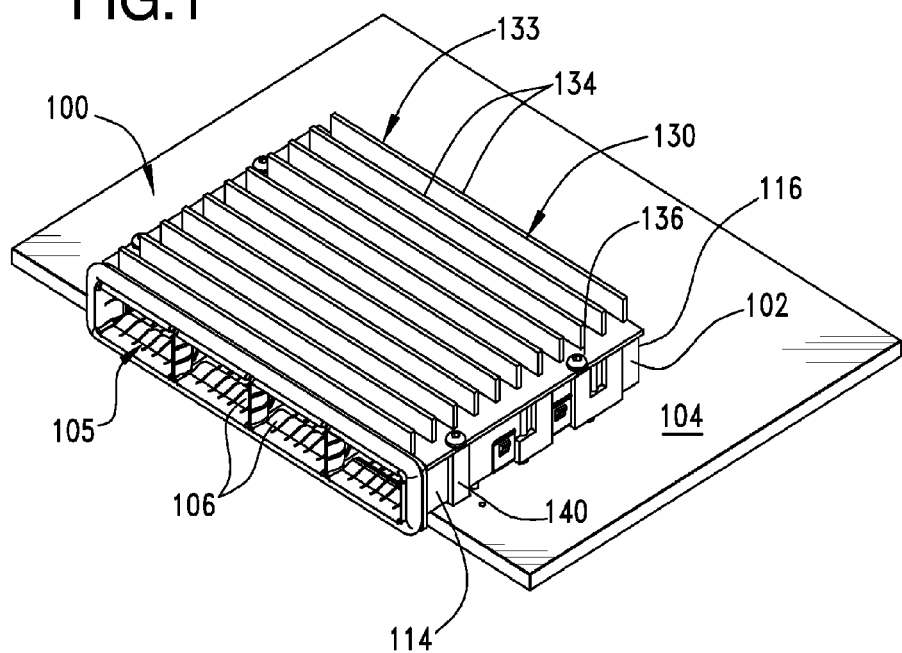
FIG. 1 is a perspective view of an adapter frame assembly of the Present Disclosure mounted on a circuit board.
Figure 2:
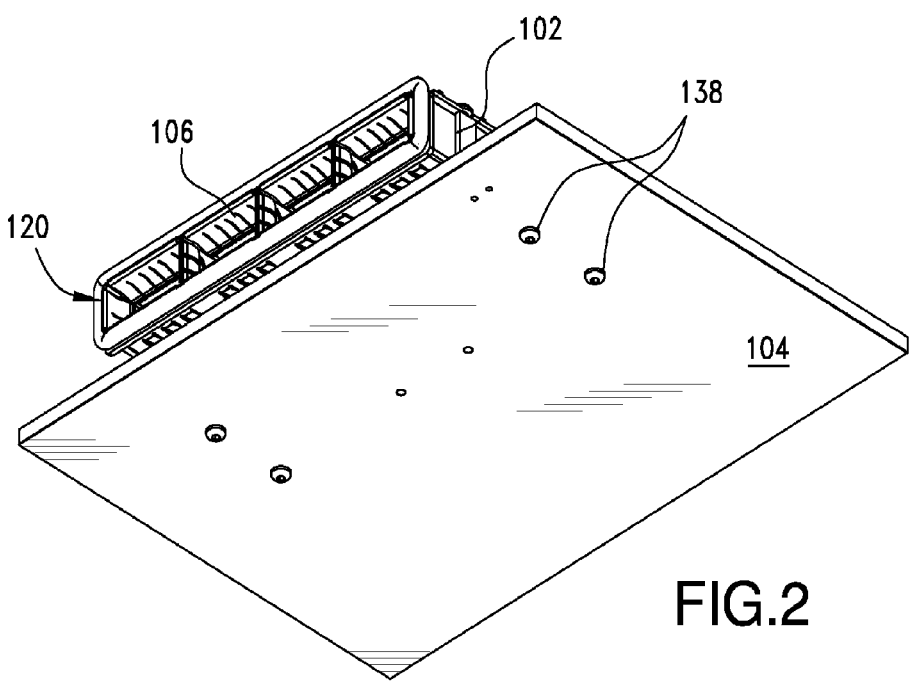
FIG. 2 is an underside perspective view of the adapter frame assembly of FIG. 1.
Figure 3:
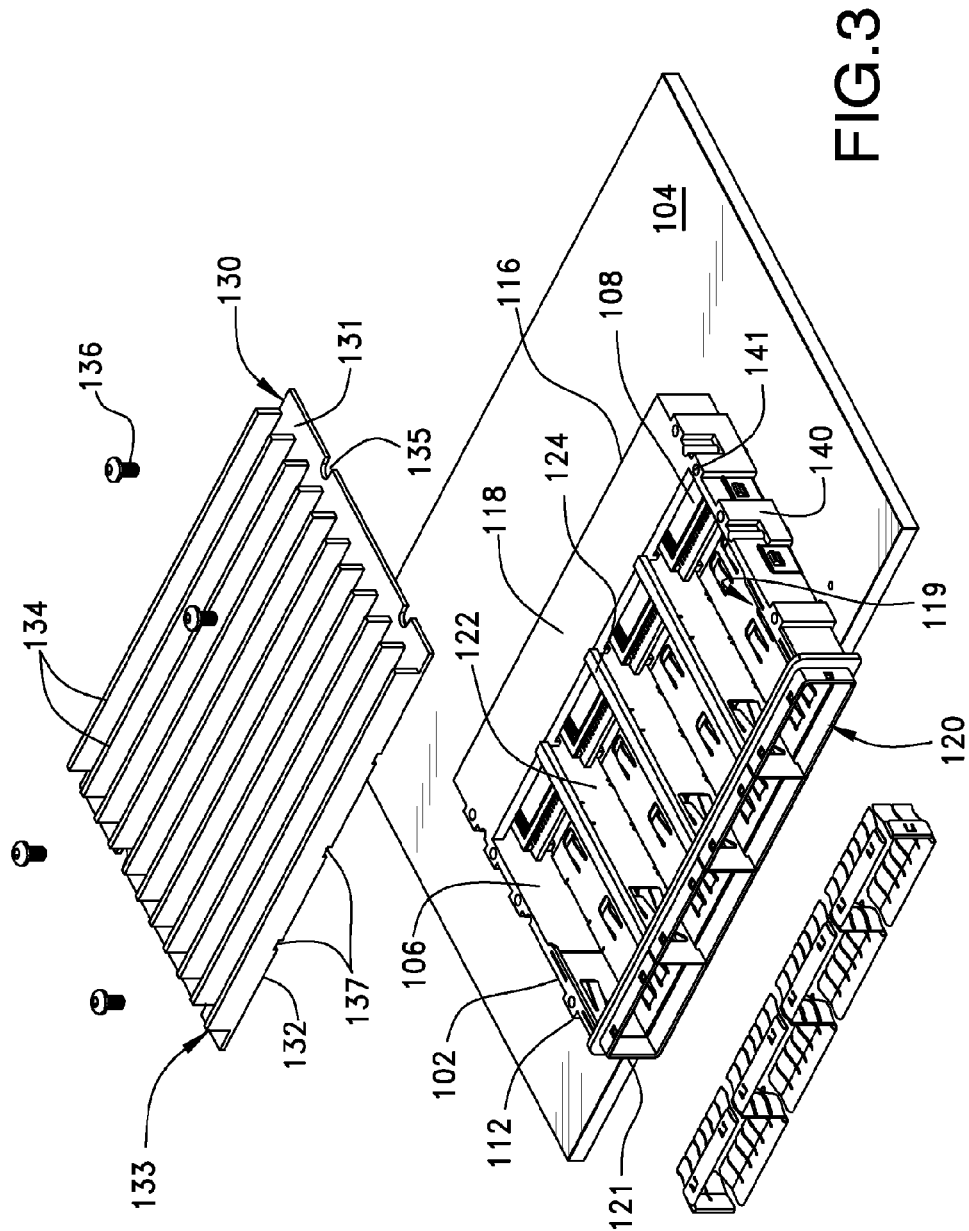
FIG. 3 is an exploded view of the adapter frame assembly of FIG. 1, but with the heat sink member and front EMI gasket assembly removed from adapter frame.
Figure 4:
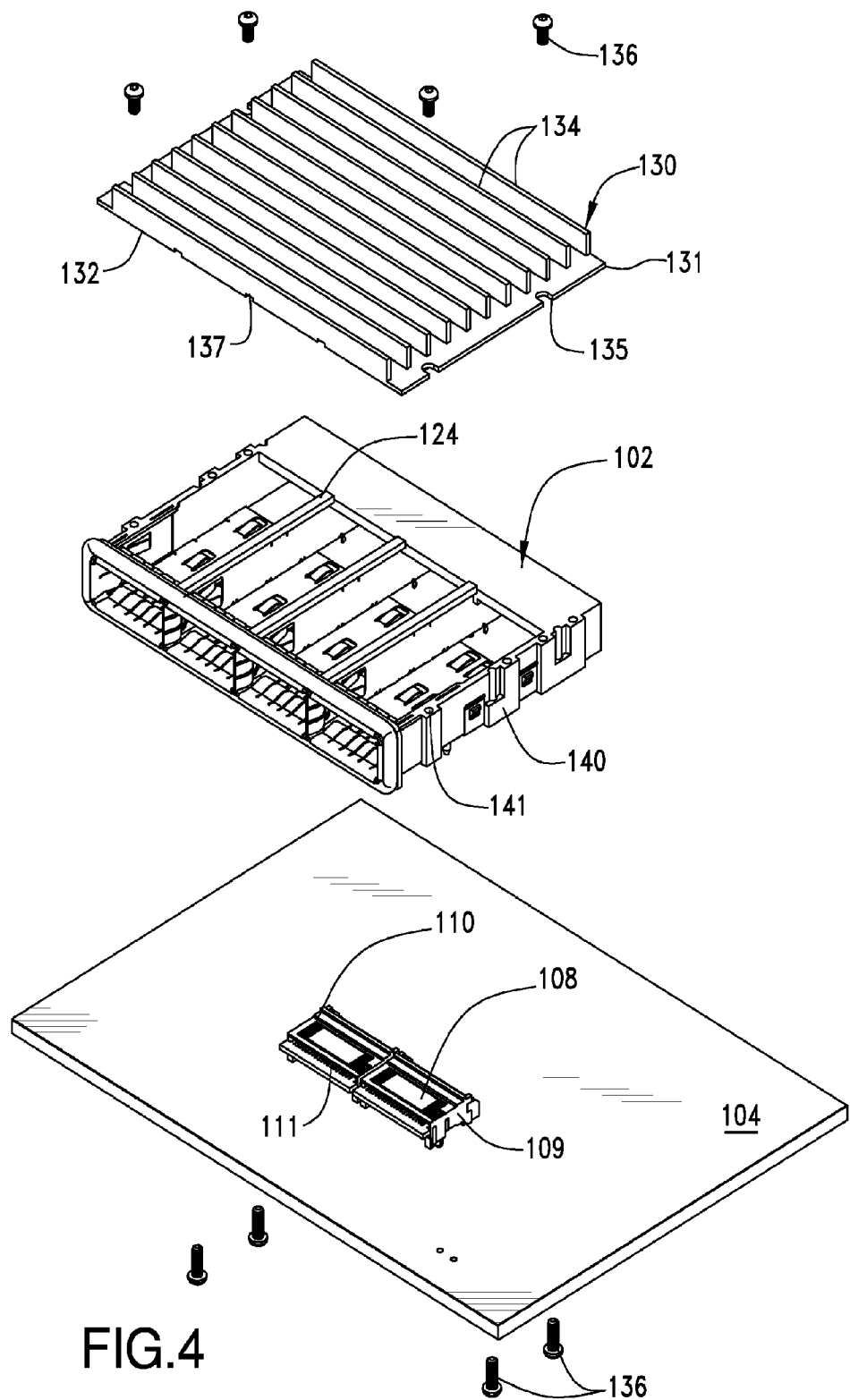
FIG. 4 is a similar view to FIG. 3, but with the adapter frame, base plate and two connectors removed from their support locations on the PCB.

FIGS. 1-14 illustrate a new receptacle connector assembly 100 constructed in accordance with this disclosure that avoids the aforementioned problems. Such an assembly 100, as illustrated, includes a guide, or adapter frame, 102 that is mounted to a circuit board 104. The adapter frame 102 is shown as having a hollow interior 105 that is divided, as shall be explained to follow, into a plurality of distinct, individual module-receiving bays 106. Each such module-receiving bay 106 is configured to receive a single electronic module (not shown) therein. Each such module-receiving bay 106 further accommodates, as illustrated in FIG. 3, a receptacle connector 108. The receptacle connectors, as illustrated in FIG. 4, each include an insulative body 109 and a plurality of conductive terminals 110, each of which has opposing tail portions and contact portions. The terminal contact portions are arranged on opposite sides of a slot 111 formed in the connector body 109, which typically will receive in mating engagement and edge card or other type of plug connector mating blade. The modules that are received in the bays 106 of the receptacle connectors 108 may be referred to as plug connectors inasmuch as that include a male mating blade which is received in the slot 111 of the receptacle connector 108.

The adapter frame 102 is illustrated as a frame that is for a "ganged" application; that is, it encloses multiple receptacle connectors 108 that are arranged adjacent each other. In the embodiment illustrated in FIGS. 1-4, the adapter frame is of a single common height and has four module-receiving bays 106 defined therein, arranged adjacent each other in a horizontal fashion. The adapter frame 102 can be seen to have a generally rectangular configuration that includes a pair of spaced apart sidewalls 112, 114, a rear wall 116 and a top wall 118 that extends partially lengthwise of the housing from the rear wall 116 and between the two sidewalls 112, 114. These walls all cooperatively define four module-receiving bays 106 of the receptacle connector assembly 100. The top wall 118, as shown best in FIGS. 3-4, which can act as a hard stop for the module, can be seen to cover only a portion of the hollow interior (that portion which is preferably located rearwardly of the mating faces of the receptacle connectors 108). The remaining portion includes an opening 119 that as shown is generally rectangular and this opening 119 extends widthwise between the two opposing sidewalls 112, 114 of the adapter frame 102 and lengthwise from proximate to a collar portion 121 of the frame 102 that extends around and serves to define an entrance 120. The opening 119 extends over all of the module-receiving bays 106, and provides a contact area for a single heat sink to be used to contact all modules associated with the adapter frame, rather than the conventional usage of individual heat sinks for each module.

The entrance 120 is provided at the front of the assembly 100 and the entrance 120 is sized to permit the insertion therein of an electronic module (not shown). The collar portion 121 permits the mounting of an EMI gasket assembly in the form of a compressible, conductive elastomeric gasket as well as a plurality of individual metal gaskets that surround each entrance 120 of each individual bay 106. The module typically includes a projecting mating blade, such as an edge card that is received within the card-receiving slot 111 of a corresponding receptacle connector 108, also mounted to the circuit board 104 and enclosed within the interior of the frame 102. A mounting collar may be disposed on the frame 102, proximate to the entrance opening 120 thereof and may include a compressible conductive gasket 124 to form an EMI seal between the frame entrance 120 and a bezel, or face plate (not shown), of the device which houses the frame 102 and its receptacle connector 108. During operation, and particularly at high data transmission speeds, heat is generated and needs to be dissipated from the module to the atmosphere. This is accomplished by providing a heat sink 130 to physically and electrically contact the inserted module, or plug connector.

Figure 5:
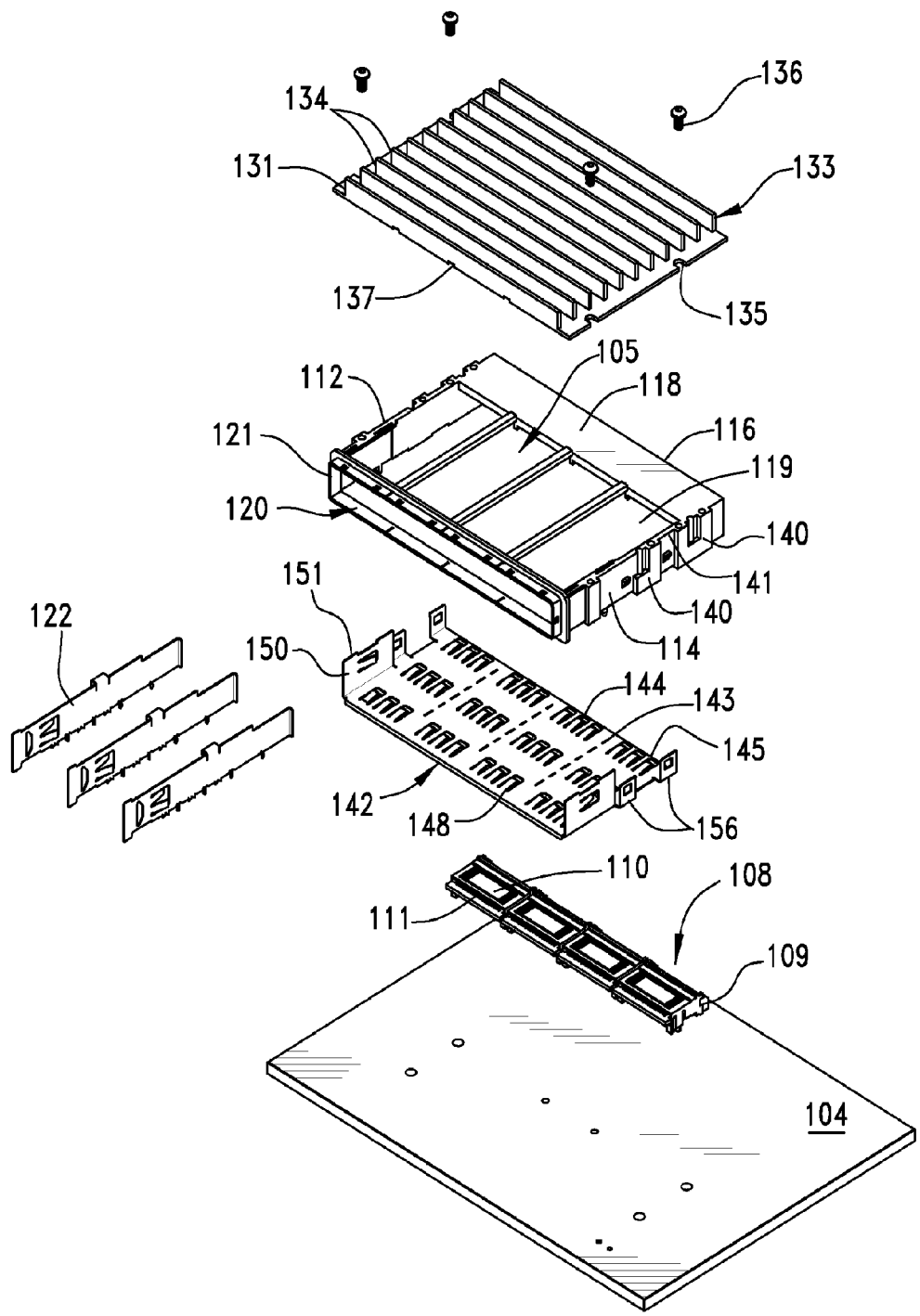
FIG. 5 is the same view as FIG. 4, but with the base plate and inner wall members removed from the adapter frame and the receptacle connectors removed from the circuit board.

The heat sink 130, as shown in FIGS. 3-5, is a rectangular, thermally conductive member, preferably one that is solid and formed from a material with good thermal conductivity. The heat sink 130 has a flat base portion 131 that defines a contacting, or thermal absorption surface, 132 of the heat sink 130. The base portion 131 extends in a horizontal plane and includes a dissipating portion 133 which includes a plurality of individual, upright fins or similar members 134 that extend upwardly from the base portion 131 and vertically above the module and the frame 102 and preferably extends widthwise of the adapter frame 102 as illustrated. The heat sink is preferably provided with a series of notches 135, formed along the edges thereof that define passages through respective threaded fasteners 136 extend. These may take the form of the notches shown, or they may include suitable openings that can accommodate the shaft of the fasteners 136. By using the threaded fasteners 136, the heat sink 130 may be applied directly in contact with all opposing surfaces of the adapter frame 102 and the use of a hold down clip is eliminated. The heat sink 130 is a single heat sink that spans each module-receiving bay 106 and provides a thermal transfer surface for each module to contact. The use of a single heat sink 130, retained in place by screws, eliminates the need for multiple heat sinks and multiple hold down clips, thereby saving on assembly cost and ensuring reliable thermal transfer contact. Elimination of the multiple heat sinks also facilitates the use of liquid-cooled pipes which may be placed in contact with the single heat sink 130, utilizing a simple pipe design rather than a complex one which may be dictated by the use of multiple heat sinks.

As will be explained in detail below, the heat sink base portion 131 may further include one or more slots 137 that are formed in the bottom surface of the base portion 131 and which are spaced apart in a spacing that matches that of the inner walls 122 which divide the interior of the frame into individual module-receiving bays 106. This permits the heat sink member 130 to reliably contact the adapter frame ribs, and extend down in the spaces between the ribs into contact with the top surfaces of modules inserted into the module-receiving bays 106. Alternatively, the adapter frame ribs may be omitted. As noted earlier, the adapter frame 102 is formed of a solid conductive material and preferably, the adapter frame 102 should be die cast from metal. Casting the adapter frame 102 gives the frame a needed measure of robustness, not only in its mounting to the circuit board 104, which may be effected by way of threaded fasteners 138, such as the screws shown, but also provides a solid body with no penetrations or openings that would present an EMI leakage or interference problem. In this regard, the adapter frame 102 is provided with thicker, boss-type portions 140 along its perimeter, which define areas in which retention taps, i.e., threaded holes 141 may be drilled, or be adapted for a board-to-board connection. Flat head screws 138 may be utilized to attach the adapter frame 102 to the circuit board 104 so that they lie flush with the circuit board and will therefore permit belly-to-belly mounting of two such adapter frames 102 on opposite sides of a circuit board 104 as is required by some, high-density applications. The use of a cast solid body for the adapter frame 102 and the manner of fastening illustrated also resists stresses that may be generated during insertion and removal of plug connectors or modules from their connection to respective connectors 108 enclosed in the module-receiving bays 106.

Figure 6:
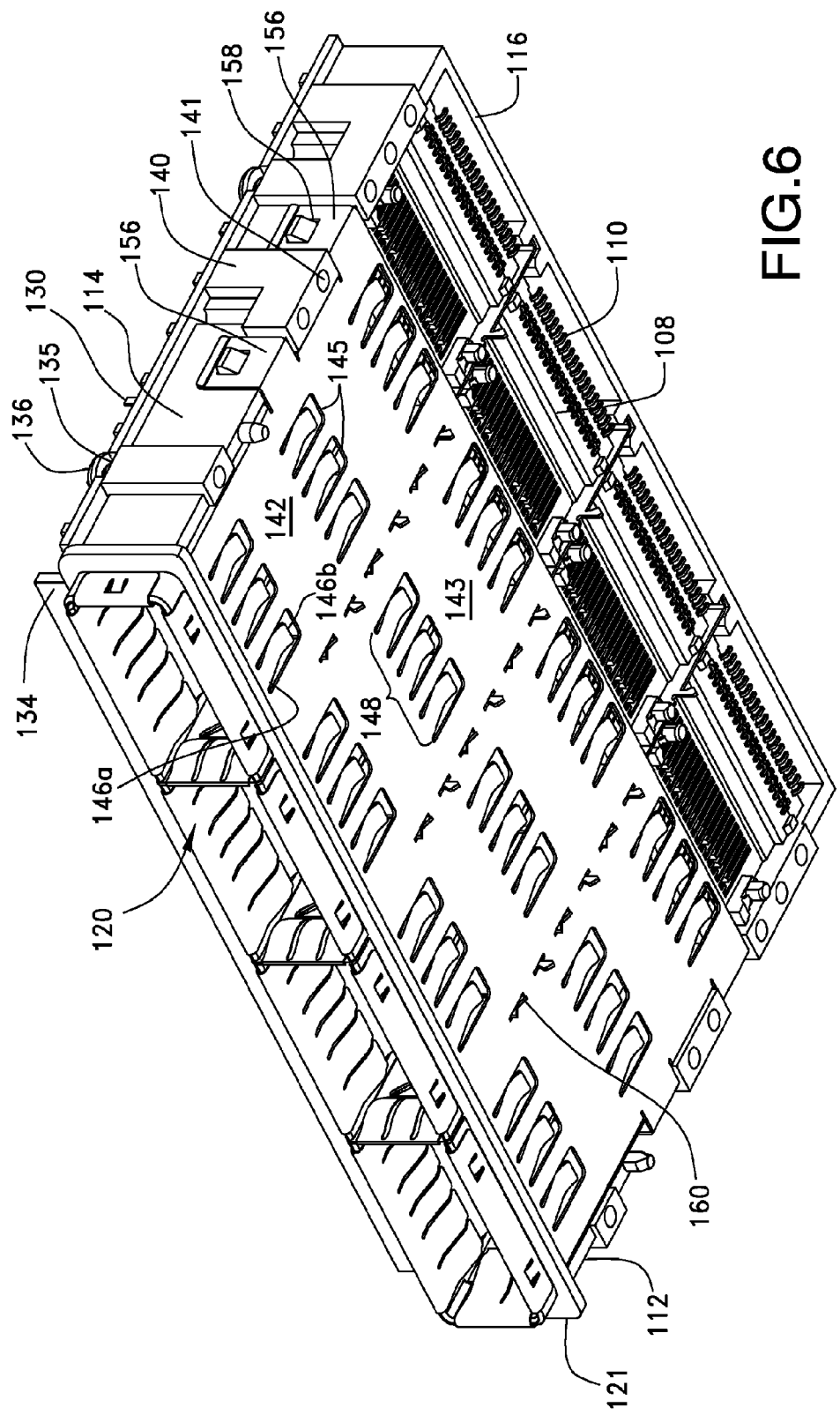
FIG. 6 is the frame assembly of FIG. 2, removed from a supporting PCB.
Figure 7:
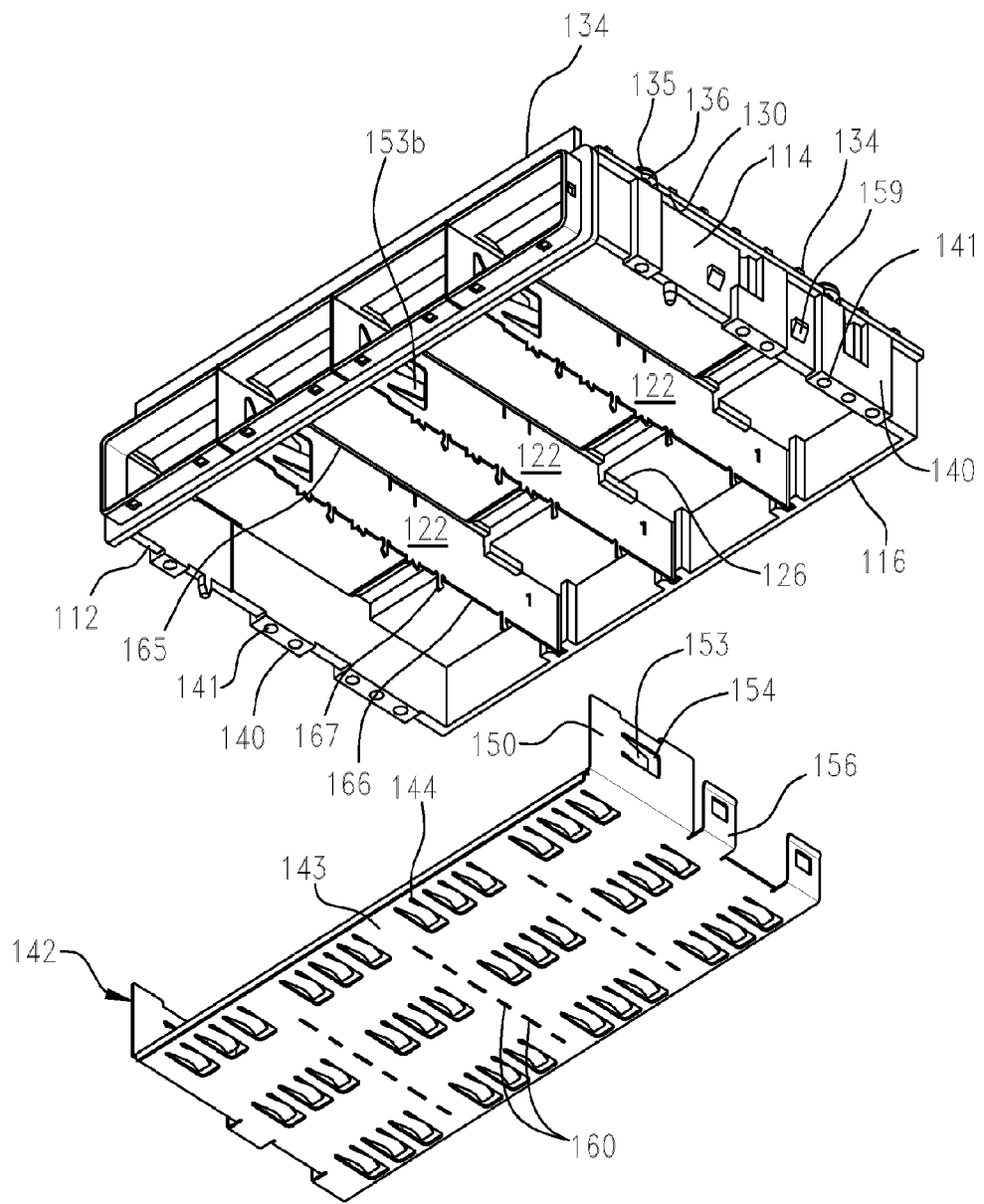
FIG. 7 is the same view as FIG. 6, but with the inner, receptacle connectors and front entrance EMI gaskets removed for clarity, and with the base plate illustrated as spaced apart from the adapter frame, but with the inner wall members and heat sink in place thereof.

In order to prevent the poor contact problem between the modules and the heat sink discussed above, that occurs from out of tolerance modules being used with adapter frames of the Present Disclosure, an insert member 142 is provided. This insert member 142 is formed a conductive material, preferably sheet metal, and defines a bottom wall of the adapter frame 102 when in place and consequently shall be referred to in this detailed description as a base plate 143. Inasmuch as the base plate 143 is formed from a material different than that of the die cast adapter frame 102, the adapter frame assembly of the Present Disclosure posses a hybrid construction. Importantly, a plurality of flexible conductive contact members, or arms 144, may be formed in the base plate 143 in a cantilevered fashion having a base end 146*a* that is attached to the base plate 143 and a free end 146*b*. These contact members 144 may be formed by stamping out a window, or a U-shaped slot 145 from the base plate 143 that surrounds the contact members 144 on three sides as shown. (FIGS. 6 & 9A.) The contact members 144 are formed to have a curved contact area 147 that are formed so as to be disposed above the level, or plane, of the base plate 143 as illustrated best in FIG. 9B.

In this fashion, the contact members 144 are formed as cantilevered contact members or arms, each of which has an elongated body portion joined to the base plate 143 and a free end 146*b* that can freely deflect under pressure of the module when it is inserted into one of the module-receiving bays 106. The contact members 144 are thin and resilient, so that they are inherently elastic in nature. In order to provide a reliable point contact, it is preferred that each contact member 144 is curved as shown in FIG. 6. This curvature also effectively shortens the length of the contact member to a length that is shorter than the length of the U-shaped slot 145 so that, if needed, the contact member free end 146*b* may deflect into the slot 145 and assume a flat orientation. Such a curvature configuration may be provided by coining, although ordinary stamping will suffice. As noted, the U-shaped slot 145 permits deflection of the contact member 144 and its free end 146*b* down to a level of the base plate 143. In this manner, the contact members 144 will exert an upward pressure on the modules, when inserted into the module-receiving bays 106, thereby urging them and/or maintaining the modules in reliable contact with the primary heat transfer surface of the heat sink 130, namely the underside 132 of the heat sink 130. If the modules are slightly oversized, they can contact the base plate 143 directly and the contact members 144 can be depressed in their openings 145 and flatten out therein while electrical and thermal contact are made between the module and heat sink 130. If the modules are slightly undersized, the contact members 144 will urge them into reliable electrical and thermal contact with the heat sink 130. The contact members 144 also serve to define a plurality of electrical grounding contact points between the module and the adapter frame 102, via the base plate 143, which assist in reducing EMI leakage.

As shown best in FIG. 6, the width base plate 143 that extends between the sidewalls 112, 114 of the adapter frame 102. The length extends from proximate to the adapter frame collar 121 and proximate the front face of the receptacle connector 108. The contact members 144 are arranged on the base plate 143, as illustrated in distinct rows 148 in which the contact members 144 and their associate U-shaped slots 145 are spaced apart from each other widthwise and each row is spaced lengthwise from an adjacent row. In this manner, a uniform pattern of contact is maintained between the base plate 143 and the module inserted into the module-receiving bay 106. These contact members 144 also provide points of conductive grounding contact between the module and the adapter frame 102, via the base plate 143, for reducing EMI emissions.

Figure 8:
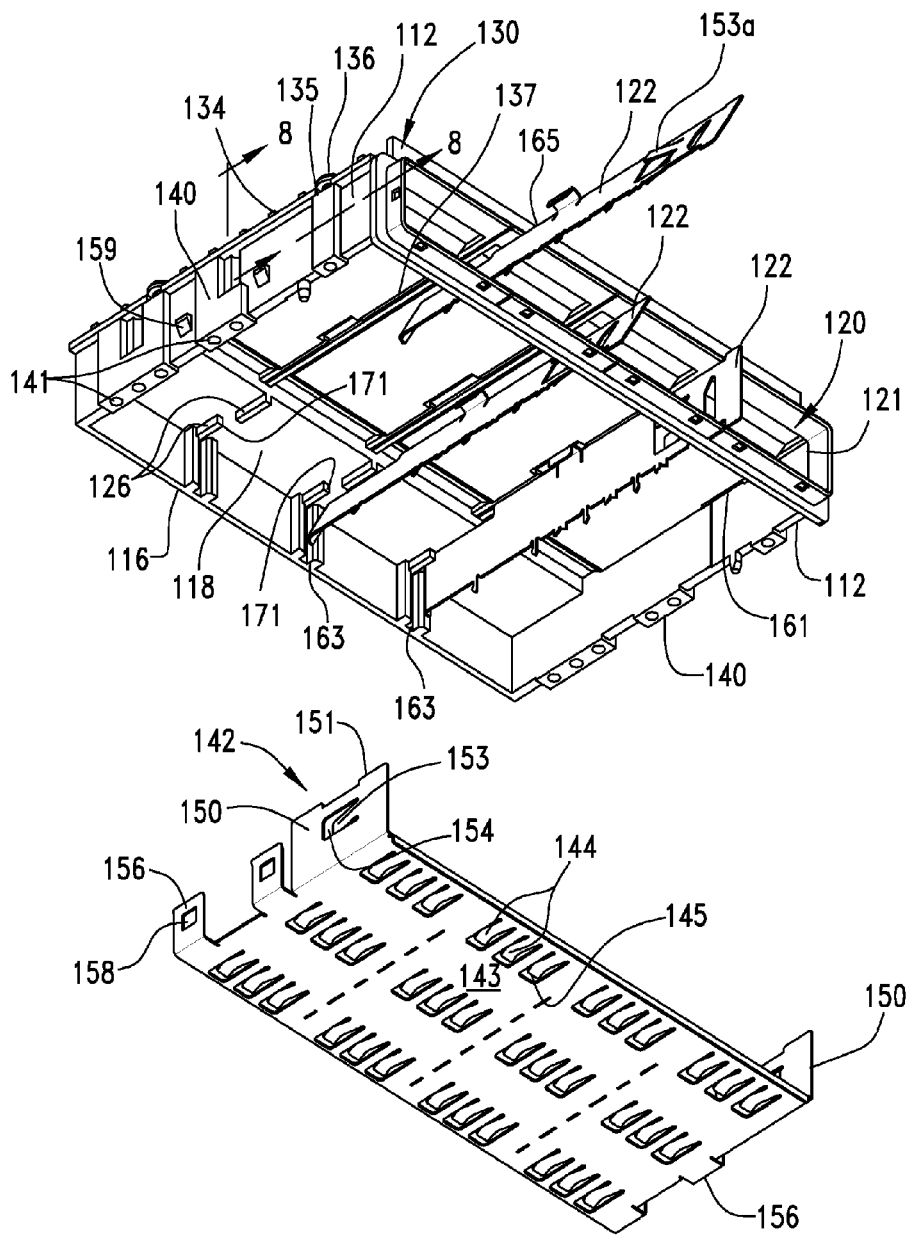
FIG. 8 is the same view as FIG. 7, oriented 90°, with the three inner wall members illustrated in various stages of insertion into the adapter frame, with the heat sink in place.
Figure 10:
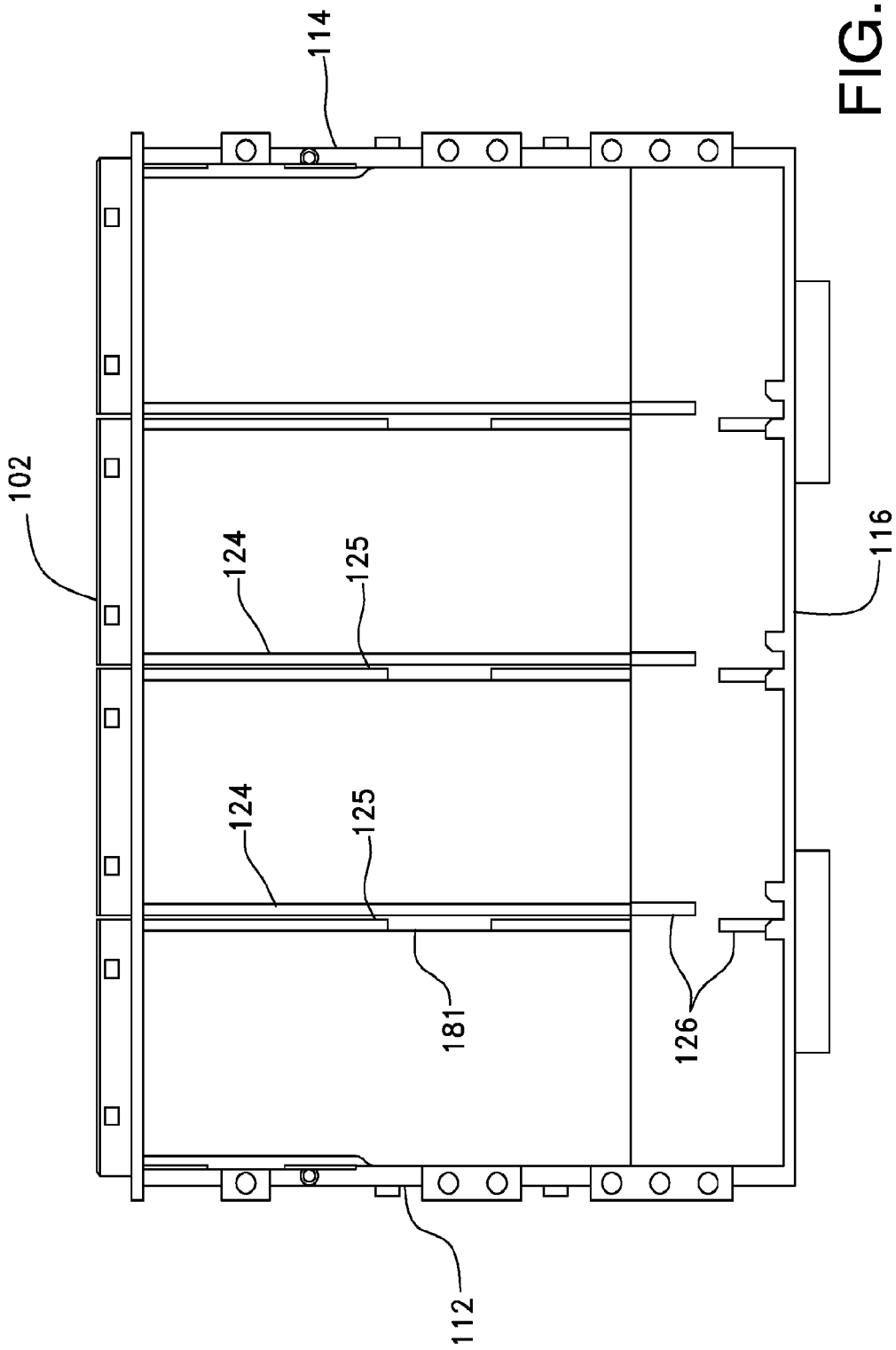
FIG. 10 is a bottom plan view of the adapter frame of the assembly of FIG. 1, with the inner wall members, base plate, heat sink and receptacle connectors removed for clarity, and illustrating the slots formed in the adapter frame ribs into which portions of the inner wall members are received.
Figure 11:
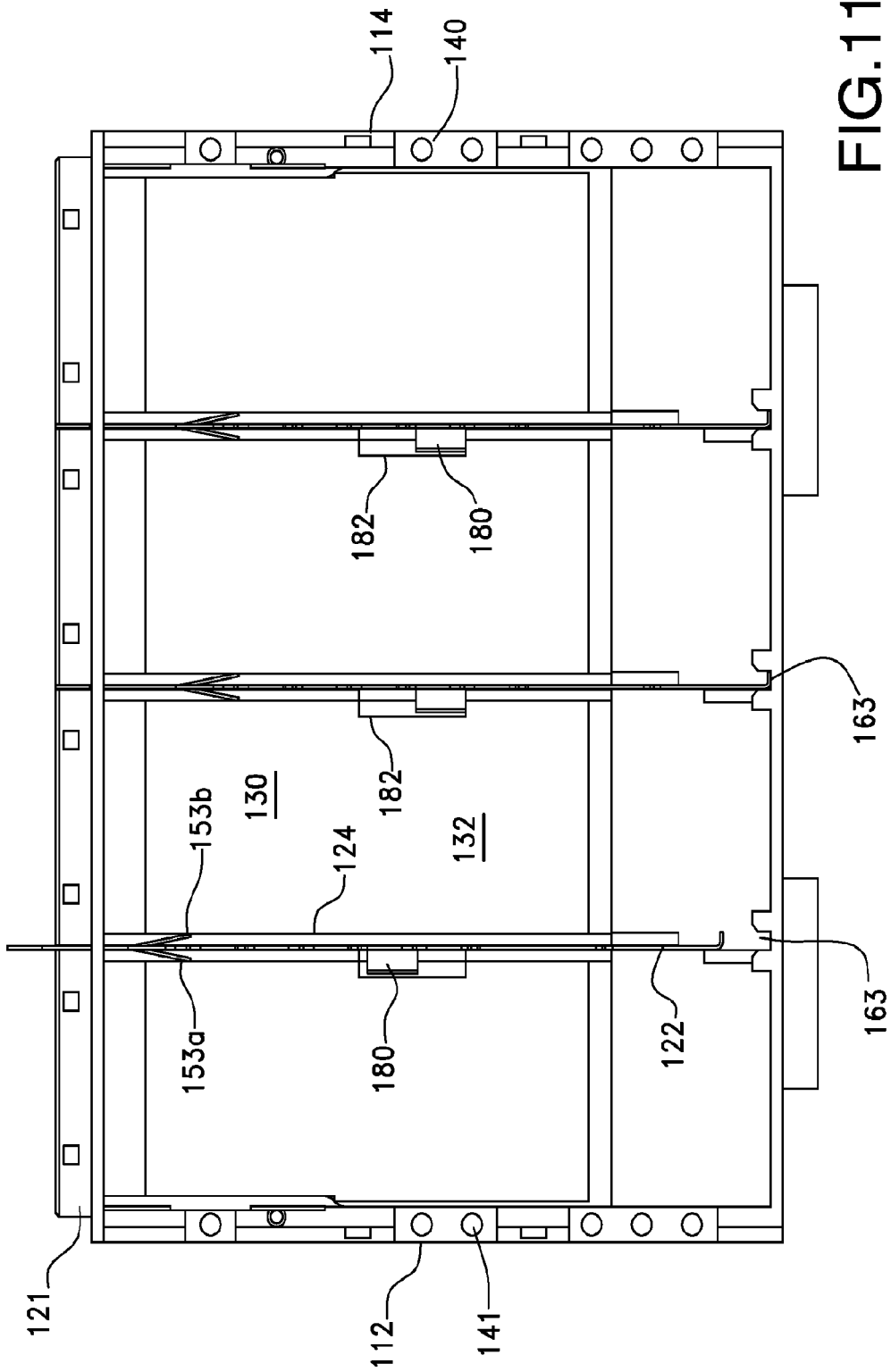
FIG. 11 is the same view as FIG. 10, but with the inner wall members in place so as to define four module-receiving bays therein and the heat sink in place thereon.
Figure 12B:
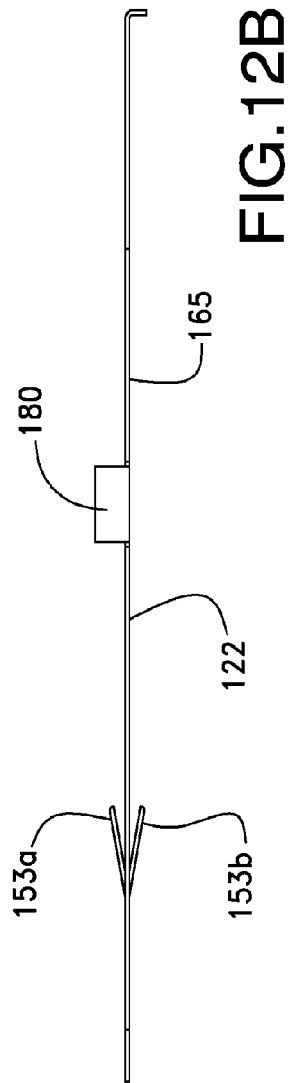
FIG. 12B is a top plan view of the inner wall member of FIG. 12A.
Figure 12A:
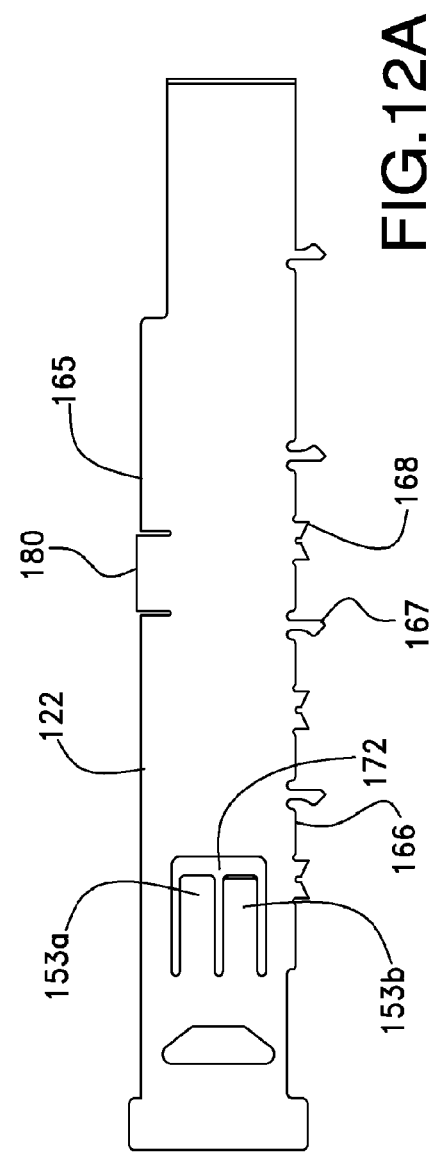
FIG. 12A is a side elevational view of one of the inner wall members used in the adapter frame assemblies of the Present Disclosure.
Figure 12C:
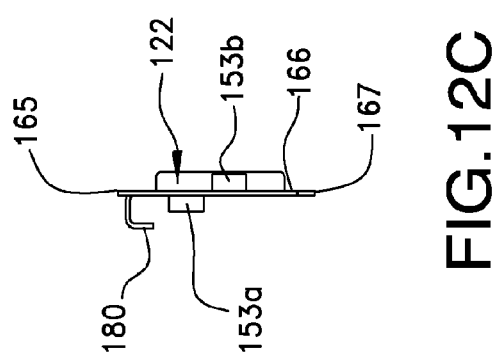
FIG. 12C is a front elevational view of the inner wall member of FIG. 12A.
Figure 13:
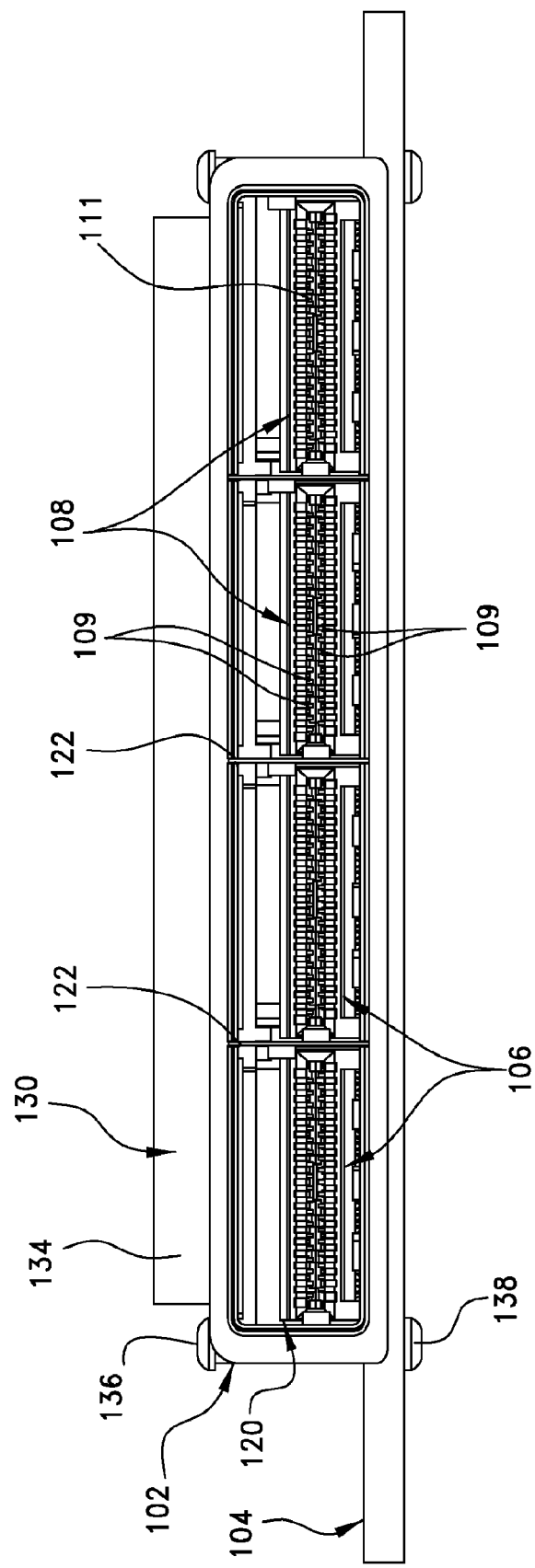
FIG. 13 is a front elevational view of the adapter assembly of FIG. 1.
Figure 14:
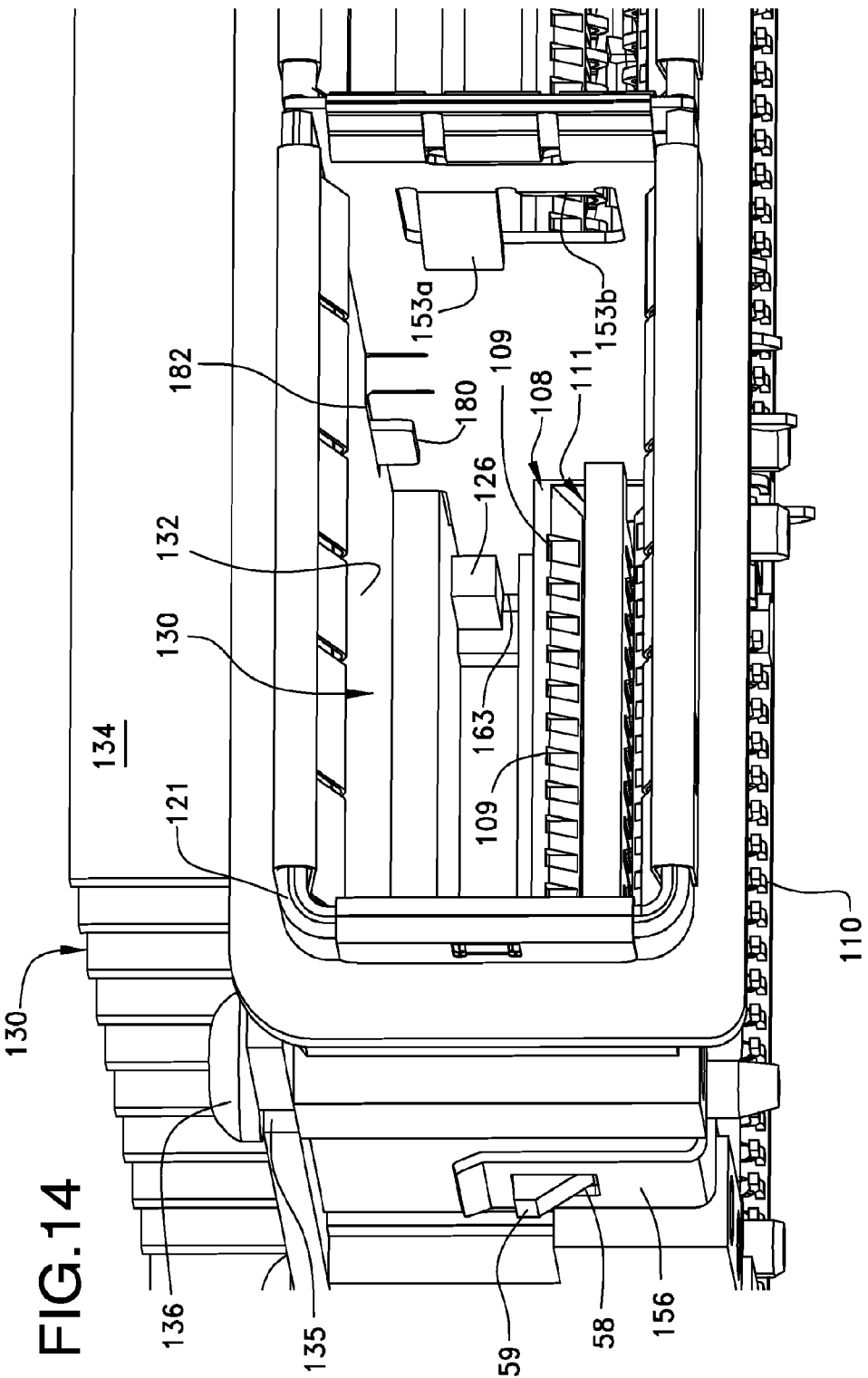
FIG. 14 is an enlarged detail view of the leftmost module-receiving bay of the adapter assembly of FIG. 13.

Turning now to FIGS. 7-9B, it can be seen that the base plate 143 is provided with a plurality of engagement tabs 150, 156 that engage the adapter frame 102. These engagement tabs give the base plate 143 a U-shaped configuration when viewed from an end, and may be considered as being of two different types. The first set of engagement tabs 150 are disposed proximate the front end of the base plate and are shown as being wider than any of the second set of engagement tabs 156. The first engagement tabs 150 are provided in a pair disposed on opposite edges, or sides, of the base plate 143 and preferably aligned with each other. They extend lengthwise along the base plate edges and may include one or more engagement tips 151 which are received within corresponding slots 161 which are formed in the sidewalls 112, 114 of the adapter frame 102, also proximate to the entrance 120 and collar 121 of the adapter frame 102. (FIGS. 8 & 10.) As such, the first engagement tabs 150 extend along the inner surfaces of the respective sidewalls 112, 114 and preferably lie flush thereagainst. These first engagement tabs 150 not only hold the base plate 143 in place on the adapter frame 102, but also may provide a latching function. A pair of U-shaped windows 154 are stamped in the first engagement tabs 150 in order to define elongated latching members 153 that are bent outwardly from the plane of the first engagement tabs 150 but which extend inwardly with respect to the interior 105 of the adapter frame. As shown, the latching members 153 extend in the rearward direction so that they will catch on stops (not shown) positioned on the modules in order to prevent the modules from falling out of the module-receiving bays 106.

The second engagement tabs 156 are also arranged in pairs on the opposite edges of the base plate, but they are spaced apart from each other widthwise and from the first engagement tabs 150 in a spacing 157 such that they engage, preferably in a flush manner, the exterior surfaces of the adapter frame sidewalls 112, 114. In this regard, the first engagement tabs 150 are separated by a first widthwise spacing and the second engagement tabs 156 are separated by a second widthwise spacing, the first and second spacings being different and the second spacing being greater than the first spacing. Hence, the engagement tabs 150, 156 serve to grip the adapter frame sidewalls 112, 114 from opposite sides. The second engagement tabs 156 may be further provided as shown with windows 158 that slip over engagement lugs 150 that are formed on the adapter frame sidewalls 112, 114.

In order to divide the hollow interior 105 into individual module-receiving bays 106, a plurality of separate inner wall members 122 are provided. Also, the adapter frame 102 is provided with a plurality of elongated ribs 124 that are formed with the adapter frame 102. The ribs 124 are spaced apart widthwise in alignment with the inner wall members 122 to form interior walls defining the module-receiving bays 106. These inner wall members 122 are spaced apart from each other widthwise and extend lengthwise between the adapter frame rear wall 116 and the frame entrance 120. The rear walls 116 include slots 163 that accommodate the rear edges of the inner wall members 122. The bottoms of the ribs 124 include elongated slots 125 that receive the top edges 165 of the inner wall members 122 so that the inner wall members 122 are aligned properly. The base plate 143 also preferably includes slots 160 that receive pins and tabs 167, 168 formed along the bottom edges of the inner wall members 122 so that the inner wall members 122 are aligned along both their top and bottom edges, 165, 166. Additional retention aspects may include alternating blocks, or lugs 126, that are disposed on and preferably formed with the adapter frame 102 along the bottom surface of the top wall 118 (FIGS. 8 & 10) that define a slot 171 therebetween into which a portion of the top edge of the inner wall members fit.

In addition to serving as dividers of the interior space 105 of the adapter frame 102, the inner wall members 122 also serve additional functions. Due to their locations, there are module-receiving bays 106 disposed on opposite, or adjacent sides of the inner wall members 122. The sidewalls 112, 114 of the adapter frame 102 include latching members 153 that are formed in the first engagement tabs 150 of the insert member 142. In order to provide latching ability in all of the module-receiving bays 106 the inner wall members 122 are stamped proximate their front ends with E-shaped windows 172 that define a pair of latching members 153a, 153b. These latching members 153a, 153b are bent, as shown in the drawings out of the plane of the inner wall members 122 so as to project into the adjacent module-receiving bays 106, and angled backwards so that they can engage stops formed on the modules which prevent the modules from being removed unless intended. Still further the inner wall members 122 are provided with structure that provides a polarizing or keying aspect to each module-receiving bay 106 in order to prevent the wrong module from being inserted thereinto or from a correct module being inserted incorrectly thereinto, such as in an inverted orientation. As shown best in FIGS. 11, 12C and 14, a portion of the inner wall members along the top edges 165 thereof is stamped and formed into an inverted U-shape stop 180 that preferably extends up along the heat sink away from the plane of the inner wall member 122 and into an adjacent module-receiving bay 106. This stop 180 projects a preselected distance into the module-receiving bay 106 and may be accommodate in a slot formed in the side of the module so that the module is capable of being inserted in only one and a correct orientation. The adapter frame ribs 124 are provided with a wide slot 181, as shown in FIG. 10 that receives a portion of the top of the stop 180. In order to accommodate the desired width of these stops 180, the heat sink 130, and particularly the underside surface 132 thereof, is also provided with slots 182 that receive a portion of the upper legs of the stops 180. These slots permit the heat sink to provide a solid and level thermal surface 132 in the adapter frame interior 105 for reliable contact with the modules. With this construction, the inner wall members 122 are inserted into the adapter frame 102 in an insert and rotate manner as shown in FIGS. 8-9B. The inner wall members are inserted and then aligned with the slots 163, 171, 124 and 182 and snapped into place.

Figure 15:
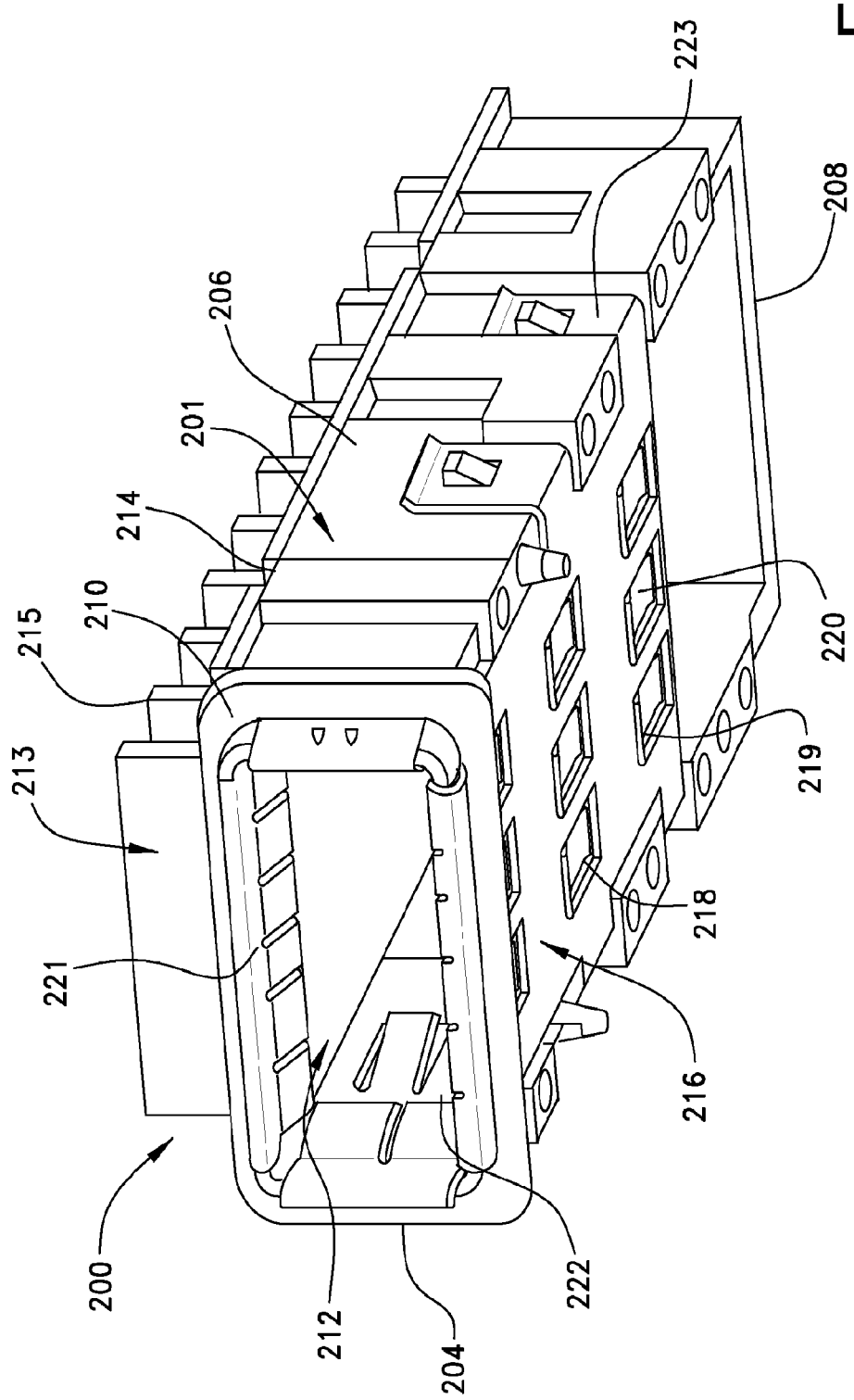
FIG. 15 is a perspective view, taken from the underside thereof, of another embodiment of an adapter frame of the Present Disclosure, having a single module-receiving bay.
Figure 16:
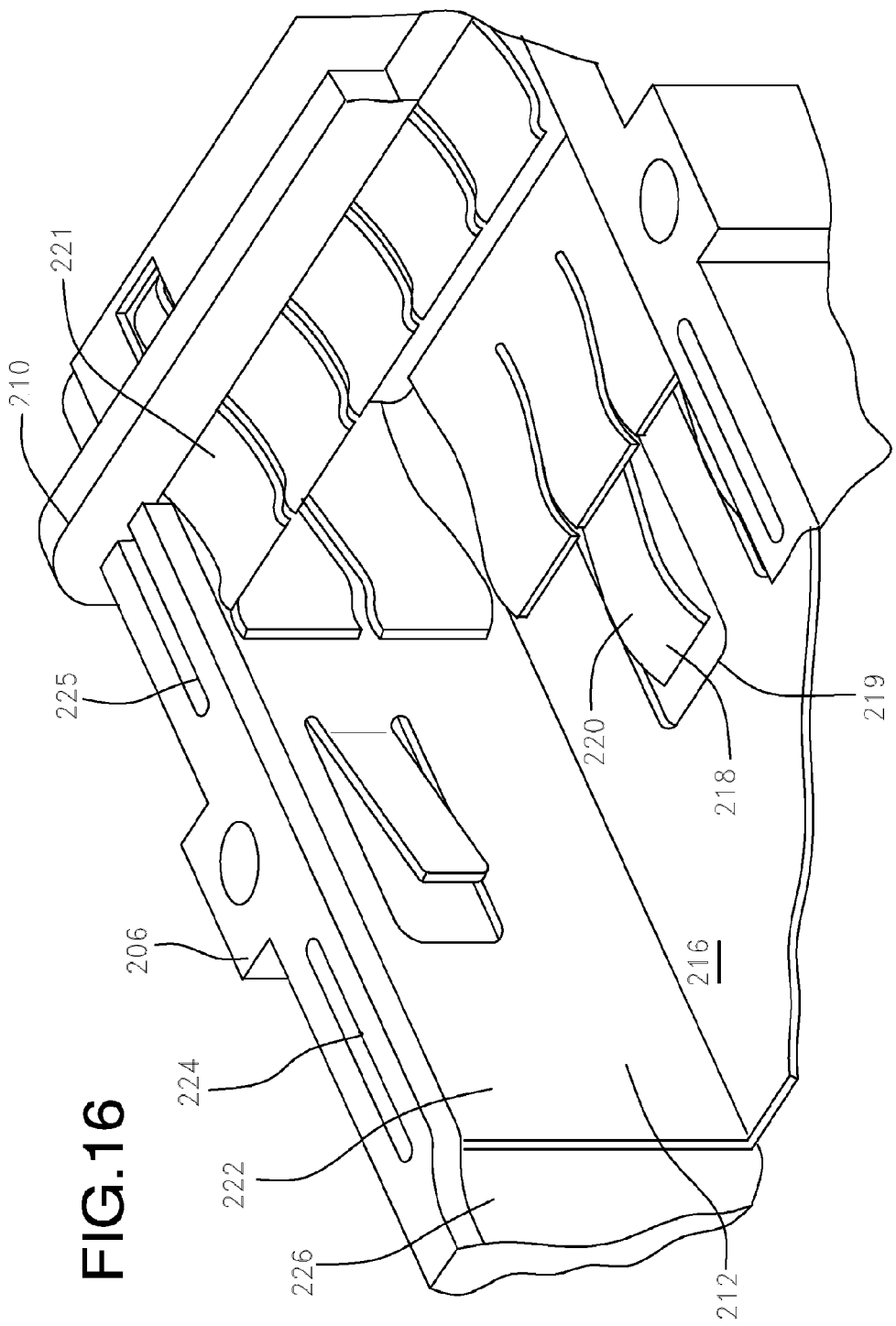
FIG. 16 is a perspective simplified view of the embodiment depicted in FIG. 15 with a heat sink omitted.

FIGS. 15-17 illustrate another embodiment of a hybrid adapter frame 200 constructed in accordance with the principles of the Present Disclosure, but in the setting of a adapter frame 200 that encloses only a single receptacle connector and consequently accommodates a single module or plug connector. As shown, the adapter frame 200 includes a solid, preferably die cast body portion 201 that has two opposing sidewalls 204, 206, an end wall 208 and an entrance collar 210 that cooperatively define a module-receiving bay 212 that is open to the entrance thereof and the top of the adapter frame 200 which is left open. A solid heat sink 213 is provide that fits over the top of the adapter frame 200 and rests on the tops of the two sidewalls 204, 206 and likewise is secured thereto by way of threaded fasteners or the like that are received in notches 214 formed along the edges of the heat sink 213. The heat sink 213 includes a plurality of upright heat transfer fins 215 that preferably extend transversely with respect to longitudinal axis of the module-receiving bay 212 (alternatively, the fins 215 may be pins, or the fins 215 may extend in any direction). A sheet metal base plate 216 is provided to define a partial bottom wall of the adapter frame and the module-receiving bay 212 and as noted in the earlier embodiment, the base plate 216 includes a plurality of contact members 218 formed therewith in U-shaped slots 219. The contact members 218 are cantilevered and have curved contact portions 220 disposed thereon between where they are joined to the base plate 216 and the free ends thereof 221. These curved contact portions 220 extend up into the interior of the adapter frame 200 and are located in front of the receptacle connector (not shown) enclosed by the adapter frame. A series of EMI gaskets are provided for the entrance and are at least partially which the entrance collar 210.

As with the other embodiment, the base plate 216 includes pairs of engagement tabs 222, 223 that engage the opposite sides of the adapter frame sidewalls 204, 206. The first set of tabs 222 engage the adapter frame proximate the entrance thereof and include engagement tips 224 that are received in slots 225 formed in the adapter frame so that the first engagement tabs lie preferably flush along the inner surface 226 of the sidewalls. As with the other embodiment described above, the first engagement tabs may be angled slightly in one direction, such as outwardly so that they are inherently biased against the sidewall inner surfaces 226. This is shown best in FIG. 17 and the first tabs 22 may also include latching members 225 that extend into the module-receiving bay 212 to engage an inserted module. The module will typically equipped with a delatching mechanism by which an operator shall be able to disengage the latching member from its stop contact with the module. The second set of engagement tabs 223 engage the outer surfaces 228 of the adapter frame 200 by way of lugs or the like.

It should be apparent that adapter frames in accordance with the Present Disclosure provide a hybrid solution to the many problems discussed above with the prior art. The solid die cast body can be secured to the circuit board in a manner which resists the stresses generated during insertion and removal of the modules from the adapter frame module-receiving bays, while the elastic contact members that maintain contact between the modules and the heat sink can be easily formed in the sheet metal base, leading to a simplicity in design that saves both manufacturing and assembly cost.

While a preferred embodiment of the Present Disclosure is shown and described, it is envisioned that those skilled in the art may devise various modifications without departing from the spirit and scope of the foregoing Description and the appended Claims.

What is claimed is:

1. A receptacle connector assembly, comprising:
a receptacle connector, the receptacle connector including a body and a plurality of conductive terminals supported thereby;
a housing, the housing enclosing the receptacle connector and including: a plurality of walls cooperatively defining a hollow module-receiving interior, the interior configured to receive the receptacle connector and a plug connector therein, an open entrance which permits insertion of the plug connector into the interior and into mating engagement with the receptacle connector, and a top portion, the top portion including an opening defined therein extending between opposing side walls of the housing, the housing further including at least a pair of engagement members disposed on the opposing side walls;
a heat sink member, the heat sink member extending over the opening to define a ceiling of the interior; and
a base plate, the base plate being configured to attach to the housing and define a bottom portion of the interior, the base plate including a plurality of upright tab members configured to engage the side walls of the housing, the upright tab members including a first pair of upright tab members spaced apart from each other on opposite sides of the base plate in a first spacing, and a second pair of upright tab members spaced apart from each other on opposite sides of the base plate in a second spacing, the first and second spacings being different such the first and second pairs respectively engage opposite surfaces of the housing sidewalls, and one of the first and second pairs further include latching members that extend therefrom into the interior.

2. The receptacle connector assembly of claim 1, wherein the base plate includes a plurality of contact members, and each contact member contacts a surface of the module after insertion thereof into the interior and urging the module into contact with the heat sink member.

3. The receptacle connector assembly of claim 2, wherein the housing further includes an adapter frame.

4. The receptacle connector assembly of claim 2, wherein each contact member is cantilevered, having respective free ends that extend above the base plate.

5. The receptacle connector assembly of claim 1, wherein the upright tab members are disposed along opposite edges of the base plate.

6. The receptacle connector assembly of claim 1, further including:
a plurality of rib members, each rib member extending lengthwise of the housing and the rib members being spaced apart from each other in a widthwise direction to partially divide the interior into a plurality of distinct portions; and
a plurality of inner wall members equal in number to the rib members, each inner wall member extending lengthwise along the rib members and vertically between the rib members and the base plate to define inner walls of the housing, which, in cooperation with the housing sidewalls, define a plurality of distinct module-receiving bays, each bay being configured to enclose a single receptacle connector therein and accommodate a single module therein.

7. The receptacle connector assembly of claim 6, wherein each inner wall member includes latching members formed therewith, which extend into the bays.

8. The receptacle connector assembly of claim 6, wherein each inner wall member includes module-orienting members, the module-orienting members extending therefrom and preventing a module from being inserted into the bay in an incorrect orientation.

9. The receptacle connector assembly of claim 1, further including an EMI gasket arranged around an entrance opening thereof.

10. A multi-bay receptacle configured to receive a plurality of plug connectors, the receptacle comprising:
a guide frame, the guide frame including a plurality of outer walls which cooperatively define a hollow interior space of the receptacle when the receptacle is mounted to a surface of a circuit board, a plurality of inner walls which cooperatively define, in combination with the outer walls, a plurality of individual plug-connector receiving bays, each bay being configured to receive a single plug connector therein, the inner walls include latching members that extend into the guide frame interior from opposite sides of the inner walls and an opening, the opening being disposed in a top portion and extending over the bays;
a heat sink member, the heat sink member being engagable with the guide frame and extending across the opening; and
a base plate, the base plate being engagable with the guide frame and extending across the bays to form bottoms of the bays;
first and second tab members, the first tab members extending up from the base plate along exterior surfaces of the guide frame and engaging engagement disposed on the guide frame, the second tab members being spaced apart from the first tab members and also extending up from the base plate and including latching members that extend into the interior of the guide frame, the base plate further including a plurality of contact members formed therein, each contact member extending from the base plate in a cantilevered fashion and formed so as to provide an urging force against a plug connector inserted in any of the bays and into contact with the heat sink member.

11. The receptacle of claim 10, wherein each contact member is arranged in the base plate in discrete, spaced apart rows, with multiple rows being disposed in each of the bays.

12. The receptacle of claim 10, wherein the second tab members are disposed proximate to an entrance opening of the receptacle.

13. The receptacle of claim 10, wherein the guide frame and heat sink member are die cast from a conductive material, and the base plate and inner walls are formed from sheet metal.

14. The receptacle of claim 10, wherein the guide frame further includes a plurality of elongated ribs, the ribs extending lengthwise, are spaced apart from each other in a widthwise direction and engage the inner walls to hold them in a vertical orientation within the guide frame.

15. The receptacle of claim 10, wherein the inner walls include plug connector stop members, formed therewith and extending into the bays, the stop members preventing the insertion of a plug connector incorrectly into a bay.

16. A hybrid housing for enclosing a receptacle connector, comprising:
an adapter frame, the adapter frame being formed from a solid, cast material and including a plurality of interconnected walls, cooperatively defining a hollow interior space therein configured to receive at least one receptacle connector therein, and an opening disposed in a top portion thereof;
a solid heat sink member, the heat sink member being attached to the adapter frame so as define a flat heat transfer surface extending within the top portions opening at a preselected level, closing off the top portion opening, and extending between opposing walls of the adapter frame; and a base plate, the base plate being formed of sheet metal, being attached to the adapter frame so as to define a bottom surface of the adapter frame interior space, the base plate including pairs first and second tab members extending upwardly therefrom, the first tab members being separated by a first spacing and the second tab members being separated by a second spacing, the first spacing being greater than the second spacing such that the first and second tab members extend respectively upwardly along exterior and interior surfaces of the adapter frame, and the base plate further including a plurality of contact members disposed thereon that exert a pressing force on any module inserted into the adapter frame interior space, the pressing force occurring in a direction toward the heat sink.

17. The hybrid housing of claim 16, further including at least one inner wall member disposed in the adapter frame interior space, and dividing the adapter frame interior space into a plurality of module-receiving bays, each bay being configured to receive a module therein, the inner wall member including latching members that extend into the module-receiving bays from opposite sides of the inner wall member.

18. The hybrid housing of claim 17, wherein the base plate further includes a plurality of U-shaped windows defining the contact members, each contact member being cantilevered and having a curved contact surface disposed within the adapter frame interior space which extends at a level above the plane of the base plate.

19. A receptacle connector assembly, comprising:
a receptacle connector, the receptacle connector including a body and a plurality of conductive terminals supported thereby;
a housing, the housing enclosing the receptacle connector and including: a plurality of walls cooperatively defining a hollow module-receiving interior, the interior configured to receive the receptacle connector and a plug connector therein, an open entrance which permits insertion of the plug connector into the interior and into mating engagement with the receptacle connector, and a top portion, the top portion including an opening defined therein extending between opposing side walls of the housing;
a heat sink member, the heat sink member extending over the opening to define a ceiling of the interior;
a base plate, the base plate being configured to attach to the housing and define a bottom portion of the interior;
a plurality of rib members, each rib member extending lengthwise of the housing, the rib members being spaced apart from each other in a widthwise direction to partially divide the interior into a plurality of distinct portions; and,
a plurality of inner wall members equal in number to the rib members, each inner wall member extending lengthwise along the rib members and vertically between the rib members and the base plate to define inner walls of the housing, which, in cooperation with the housing sidewalls, define a plurality of distinct module-receiving bays, each bay being configured to enclose a single receptacle connector therein and accommodate a single module therein.

20. A multi-bay receptacle configured to receive a plurality of plug connectors, the receptacle comprising:
a guide frame, the guide frame including a plurality of outer walls which cooperatively define a hollow interior space of the receptacle when the receptacle is mounted to a surface of a circuit board, a plurality of inner walls which cooperatively define, in combination with the outer walls, a plurality of individual plug-connector receiving bays, each bay being configured to receive a single plug connector therein, and an opening, the opening being disposed in a top portion and extending over the bays;
a heat sink member, the heat sink member being engagable with the guide frame and extending across the opening;
a base plate, the base plate being engagable with the guide frame and extending across the bays to form bottoms of the bays, the base plate further including a plurality of contact members formed therein, each contact member extending from the base plate in a cantilevered fashion and formed so as to provide an urging force against a plug connector inserted in any of the bays and into contact with the heat sink member; and,
the guide frame further including a plurality of ribs extending lengthwise and spaced apart from each other in a widthwise direction, the ribs engaging the inner walls and holding them in a vertical orientation within the guide frame.

* * * * *